(12) United States Patent
Gu et al.

(10) Patent No.: US 10,585,643 B2
(45) Date of Patent: Mar. 10, 2020

(54) FINE-GRAINED ANALOG MEMORY DEVICE BASED ON CHARGE-TRAPPING IN HIGH-K GATE DIELECTRICS OF TRANSISTORS

(71) Applicant: THE REGENTS OF THE UNIVERSITY OF CALIFORNIA, Oakland, CA (US)

(72) Inventors: Xuefeng Gu, Los Angeles, CA (US); Subramanian S. Iyer, Los Angeles, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 15/595,680

(22) Filed: May 15, 2017

(65) Prior Publication Data

US 2017/0329575 A1     Nov. 16, 2017

Related U.S. Application Data

(60) Provisional application No. 62/336,119, filed on May 13, 2016.

(51) Int. Cl.
| | | |
|---|---|---|
| G06N 3/063 | (2006.01) | |
| G11C 11/54 | (2006.01) | |
| G06F 7/02 | (2006.01) | |
| H01L 29/792 | (2006.01) | |
| G11C 27/00 | (2006.01) | |
| G11C 16/04 | (2006.01) | |

(52) U.S. Cl.
CPC ........... *G06F 7/023* (2013.01); *G06N 3/0635* (2013.01); *G11C 11/54* (2013.01); *G11C 16/0466* (2013.01); *G11C 27/005* (2013.01); *H01L 29/792* (2013.01)

(58) Field of Classification Search
CPC .............................. G06N 3/0635; G11C 11/54
USPC ........................................................... 706/33
See application file for complete search history.

(56) References Cited

U.S. PATENT DOCUMENTS

| | | | | |
|---|---|---|---|---|
| 5,256,911 | A * | 10/1993 | Holler | ............. G06N 3/0635 706/37 |
| 9,805,302 | B2 * | 10/2017 | Kim | ............. G06N 3/049 |
| 2002/0027810 | A1 * | 3/2002 | Iida | ............. G11C 7/10 365/189.11 |
| 2012/0069679 | A1 * | 3/2012 | Fujiki | ............. G11C 16/26 365/185.23 |

(Continued)

OTHER PUBLICATIONS

Shubha Ramakrishnan, "Floating Gate Synapses With Spike-Time Dependent Plasticity", Jun. 2011, IEEE Transactions on Biomedical Circuits and Systems, vol. 5, No. 3, pp. 244-252.*

(Continued)

*Primary Examiner* — Huan Hoang
*Assistant Examiner* — Jay W. Radke
(74) *Attorney, Agent, or Firm* — Foley & Lardner LLP; Cliff Z. Liu

(57) ABSTRACT

A fine-grained analog memory device includes: 1) a charge-trapping transistor including a gate and a high-k gate dielectric; and 2) a pulse generator connected to the gate and configured to apply a positive or negative pulse to the gate to change an amount of charges trapped in the high-k gate dielectric.

6 Claims, 7 Drawing Sheets

(56) References Cited

U.S. PATENT DOCUMENTS

2014/0358834 A1* 12/2014 Kim ................ G06N 3/049
 706/25
2015/0178619 A1* 6/2015 Nishitani ............ G06N 3/04
 706/25

OTHER PUBLICATIONS

Burr, G.W. et al. (2014) "Experimental Demonstration and Tolerancing of a Large-Scale Neural Network (165,000 Synapses), Using Phase-Change Memory as the Synaptic Weight Element," 2014 IEEE International, Electron Devices Meeting (IEDM):697-700.

Khan, F. et al. (2016) "The Impact of Self-Heating on Charge Trapping in High-K-Metal-Gate nFETs," IEEE Electron Device Letter 37(1):88-91.

Kothandaraman, C. et al. (2015) "Oxygen Vacancy Traps in Hi-K/Metal Gate Technologies and Their Potential for Embedded Memory Applications," 2015 IEEE International Reliability Physics Symposium MY.2.1-MY.2.4.

Merolla, P.A. et al. (2014) "A Million Spiking-Neuron Integrated Circuit With a Scalable Communication Network and Interface," Science 345:668-673.

Prezioso, M. et al. (2015) "Training and Operation of an Integrated Neuromorphic Network Based on Metal-Oxide Memristors," Nature 521(7550):61-64.

Yu, S. et al. (2011) "An Electronic Synapse Device Based on Metal Oxide Resistive Switching Memory for Neuromorphic Computation," Electron Devices, IEEE Transactions on Electron Devices 58(8):2729-2737.

* cited by examiner

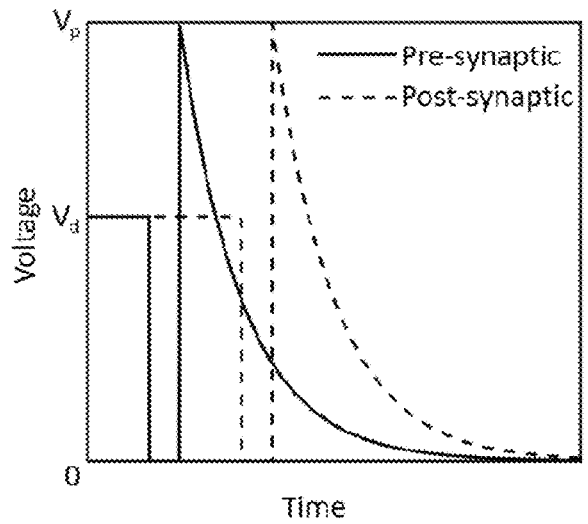
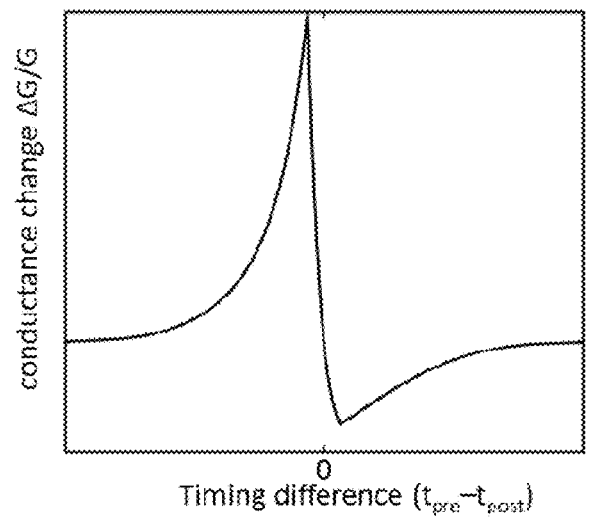
FIG. 3A
FIG. 3B
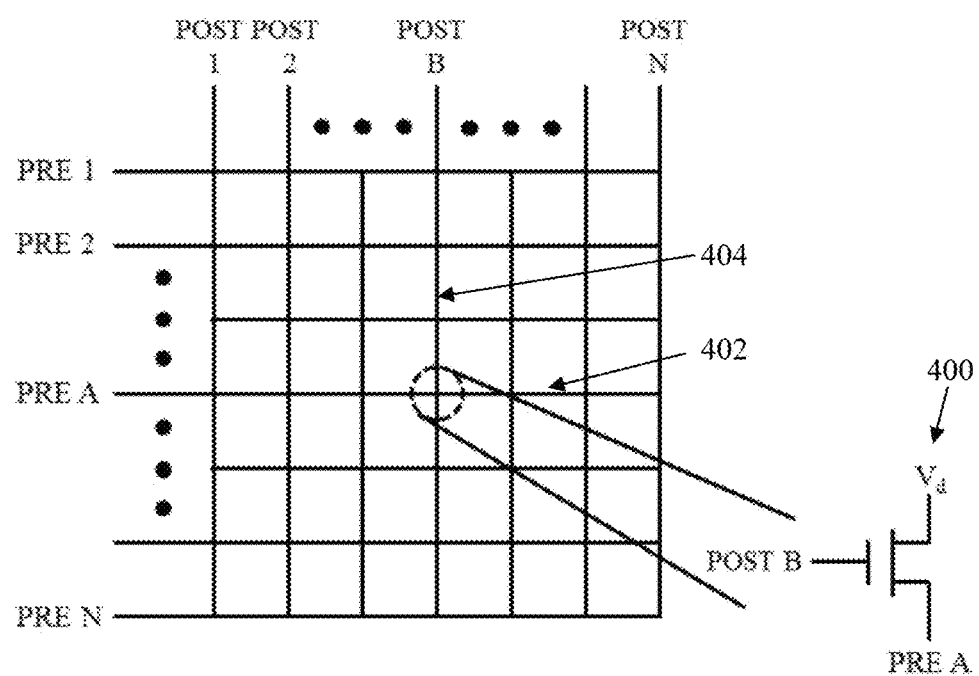
FIG. 4

FIG. 7A
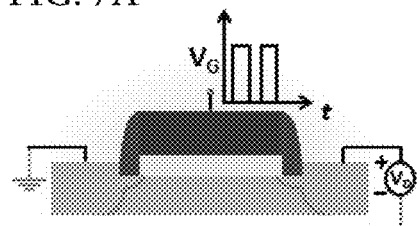
FIG. 7B
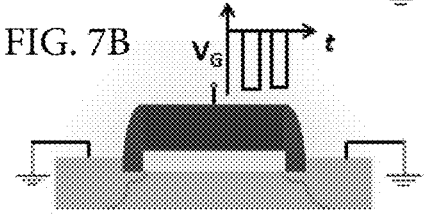
FIG. 7C
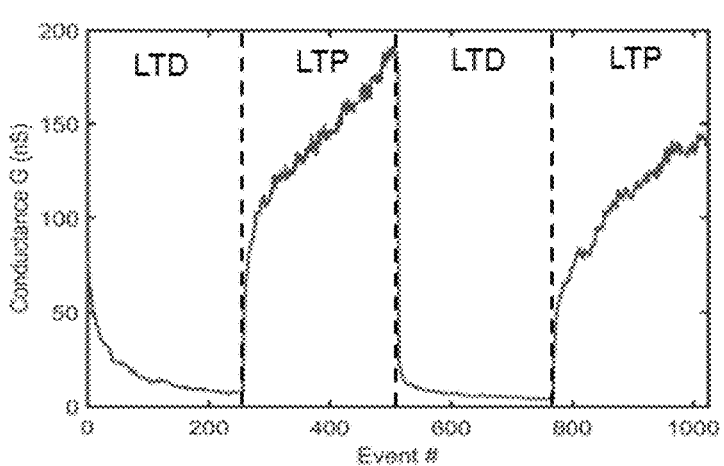
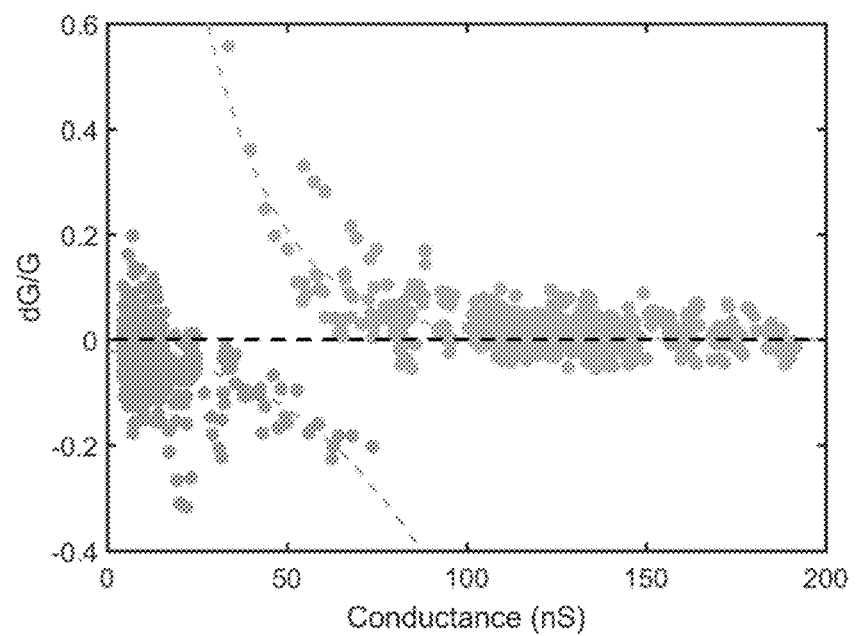
FIG. 8

FINE-GRAINED ANALOG MEMORY DEVICE BASED ON CHARGE-TRAPPING IN HIGH-K GATE DIELECTRICS OF TRANSISTORS

CROSS-REFERENCE TO RELATED APPLICATION

This application claims the benefit of U.S. Provisional Application No. 62/336,119, filed May 13, 2016, the content of which is incorporated herein by reference in its entirety.

TECHNICAL FIELD

This disclosure generally relates to the use of charge-trapping transistors as fine-grained analog memory devices. Such a device can be used in neuromorphic computing, approximate computing as well as other applications that are afforded by analog memories.

BACKGROUND

A compact, reliable, and substantially continuously tunable analog memory device is desired for many intriguing applications such as neuromorphic computing. Indeed, one of the reasons why a self-adaptive, large-scale neuromorphic system has yet to be successfully demonstrated is because of the lack of such analog memory devices to implement plastic synapses. Digital static random-access memory (SRAM) can be used to implement a synapse but occupies a large area. Analog candidates such as memristors, phase-change memory, and other exotic materials have been proposed, but present challenges from the standpoint of uniformity, reliability, and compatibility with large-scale integration.

It is against this background that a need arose to develop the embodiments described herein.

SUMMARY

According to some embodiments, states of an advanced-node field-effect transistor (FET), including, but not limited to, its threshold voltage and channel conductance at substantially fixed gate and drain biases, are continuously modified in an analog sense by applying short positive or negative gate pulses to change an amount of charges trapped in its high-k gate dielectric, and where the states can be stored as information by an analog memory device.

According to some embodiments, charge-trapping phenomenon in high-k gate dielectrics of advanced-node FETs is used to emulate the behavior of plastic biological synapses. Charge-trapping in high-k gate dielectrics can be rendered more efficient and more stable in the presence of an appropriate drain bias. With an appropriate signaling scheme, a threshold voltage change and therefore a channel conductance change at substantially fixed gate and drain biases induced by the trapped charge are a function of a timing difference between pre- and post-synaptic pulses. With suitable arrangements, a synapse device also exhibits weight-dependent plasticity, desired for unsupervised learning applications. The synapse device, combined with complementary metal-oxide semiconductor (CMOS) neuron and control circuits, provides an adaptive learning and large-scale neuromorphic system.

Some embodiments of this disclosure are directed to the application of charge-trapping transistors (CTTs) for plastic synapses in neuromorphic computing systems. Instead of using exotic materials which can introduce material and process complexities, a CTT can be implemented using the same or similar materials and processes used in systems-on-chip (SoCs). In some embodiments, the operation of a CTT is based on charge-trapping in a high-k gate dielectric induced by a gate pulse and enhanced by self-heating with a drain bias. The use of CTTs allows implementation of a large-scale neuromorphic system owing to their small size, uniformity, reliability, energy efficiency, and low integration cost. The CTT-based plastic synapses can be used in various neuromorphic applications, such as pattern recognition, adaptive learning, clustering, and large-scale reconfigurable neuromorphic platforms.

Some embodiments are directed to providing a signaling scheme which results in a CTT showing spike timing-dependent plasticity (STDP).

Some embodiments are directed to providing a framework to train an array of CTTs for the application of pattern recognition using externally applied signaling pulses.

Some embodiments are directed to providing connection of a CTT with other CMOS circuits to implement a primitive synapse device for a neuromorphic system.

Some embodiments are directed to the integration of CTT-based primitive synapse devices into a self-adaptive neuromorphic learning system.

Some embodiments are directed to configuring a CTT to exhibit weight-dependent plasticity.

Some embodiments are directed to leveraging the weight-dependent plasticity exhibited by a CTT for unsupervised learning applications, such as clustering.

In some embodiments, a fine-grained analog memory device includes: 1) a charge-trapping transistor including a gate and a high-k gate dielectric; and 2) a pulse generator connected to the gate and configured to apply a positive or negative pulse to the gate to change an amount of charges trapped in the high-k gate dielectric.

In some embodiments, a neuromorphic computing system includes: 1) a synapse device (or electronic synapse) including a CTT including a source, a gate, and a drain; 2) a first neuron device (or electronic neuron) connected to at least one terminal of the CTT (e.g., the source) and configured to apply a first signal to that terminal; 3) a second neuron device connected to at least one terminal of the CTT (e.g., the gate) and configured to apply a second signal to that terminal; and 4) a voltage source connected to the drain and configured to apply a voltage $V_d$ (nonzero) or 0 to the drain. In some embodiments, the first signal and the second signal are shifted in time. In some embodiments, each of the first signal and the second signal includes a voltage above $V_d$. In some embodiments, each of the first signal and the second signal includes a voltage below $V_d$. In some embodiments, a state of the CTT can be modified by the first neuron device alone, the second neuron device alone, or by both of the first and second neuron devices together.

In some embodiments, a neuromorphic computing system includes: 1) multiple synapse devices each including a CTT; 2) multiple first neuron devices each connected to at least one terminal (e.g., a source) of respective ones of the synapse devices; and 3) multiple second neuron devices each connected to at least one terminal (e.g., a gate) of respective ones of the synapse devices.

In some embodiments, a neuromorphic computing system includes: 1) multiple synapse devices each including a CTT; 2) a first neuron device connected to at least one terminal (e.g., a source) of each the CTTs; 3) multiple second neuron devices each connected to at least one terminal (e.g., a gate) of respective ones of the synapse devices; and 4) a voltage source which is configured to apply either a nonzero $V_d$ or zero voltage to drains of the CTTs.

In some embodiments, a neural network includes: 1) a set of input neuron devices; 2) a set of output neuron devices; and 3) a set of synapse devices, wherein the input neuron devices are connected to the output neuron devices through the synapse devices, and at least one of the synapse devices includes a CTT.

In some embodiments, a method of operating a neuromorphic computing system includes: 1) providing a synapse device including a CTT including a source, a gate, and a drain; 2) operating the synapse device in a first mode by applying a positive gate-to-source voltage to the gate and the source of the CTT for a first time duration; and 3) operating the synapse device in a second mode by applying a negative gate-to-source voltage to the gate and the source of the CTT for a second time duration. In some embodiments, operating the synapse device in the first mode further includes applying a nonzero voltage to the drain of the CTT. In some embodiments, operating the synapse device in the second mode further includes grounding the drain of the CTT.

Other embodiments are also encompassed by this disclosure. For example, although some embodiments are discussed in the context of an n-type transistor for plastic synapses, p-type transistors can be configured in a similar manner for similar applications—a trapping mechanism changes from electron trapping for n-type transistors to hole trapping for p-type transistors. Also, charge-trapping behavior of advanced-node transistors is demonstrated on both silicon-on-insulator and bulk substrates, and for both planar transistors and Fin Field Effect Transistors (FinFETs). Different signaling schemes can be used to implement different learning behaviors.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 3A illustrates a signaling scheme in a long-term potentiation mode, according to some embodiments. Signals here are identical to that in FIG. 2 except for a shift in time. In this case, a pre-synaptic pulse comes before a post-synaptic pulse, resulting in an increase of channel conductance at a substantially fixed gate bias. FIG. 3B illustrates a change in channel conductance at a substantially fixed gate bias as a function of a timing difference between pre- and post-synaptic pulses, according to some embodiments.

FIG. 4 illustrates a crossbar array with CTT-based synapse devices situated at intersections between N pre-synaptic and N post-synaptic neuron devices, according to some embodiments. For a particular CTT at an intersection of row A and column B, its drain is biased at a voltage of $V_d$, its source is connected to the pre-synaptic neuron device A, and its gate is connected to the post-synaptic neuron device B. This array can be used for pattern recognition.

FIGS. 7A-7C illustrate programming a CTT in a long-term depression mode (FIG. 7A) and a long-term potentiation mode (FIG. 7B), respectively, according to some embodiments. FIG. 7C illustrates an example of an evolution of a synaptic weight when the CTT is cycled back and forth.

FIG. 8 illustrates a CTT's weight-dependent plasticity, a desirable learning rule in unsupervised learning applications according to some embodiments.

DETAILED DESCRIPTION

According to some embodiments, a CTT can be configured as a fine-grained analog memory device. Short pulses (e.g., about 20 μs), either positive or negative, can be applied to a gate of the CTT to trap or de-trap charges. Optionally, a nonzero drain bias $V_d$ can be applied to facilitate and stabilize the process.

According to some embodiments, a CTT can be programmed to exhibit plastic learning behavior, in particular spike timing-dependent plasticity (STDP), the STDP of the CTT can be applied to pattern recognition, the CTT can be connected with CMOS circuits to implement a primitive synapse device, and the primitive synapse device can be integrated in a neuromorphic computing system. According to some embodiments, a CTT can be programmed to exhibit weight-dependent plasticity (WDP), and the WDP can be applied in an unsupervised learning neural network.

In general, a CTT can be implemented using any transistor that employs a high-k gate dielectric, such as hafnium dioxide or another dielectric with an electric permittivity of at least about 1.5 times, at least about 2 times, at least about 2.5 times, or at least about 3 times that of silicon dioxide. The operation of the CTT in some embodiments relies on a gate dielectric that is susceptible to charge trapping at an operation voltage of about 0.5 V to about 2 V. Examples include different transistor architectures, such as planar, FinFET, nanowire, and so forth, and transistors on different substrates, such as bulk silicon, silicon-on-insulator (SOI), and substrates other than silicon.

Figure 1A:
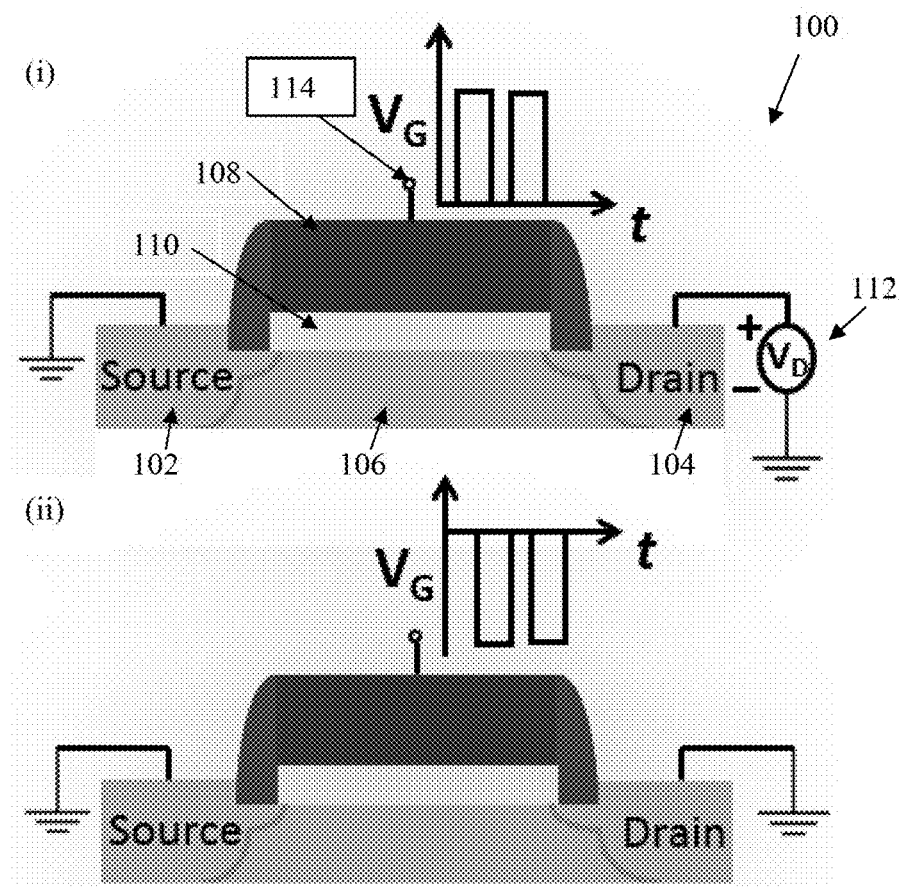
FIG. 1A illustrates the operation of a CTT as a fine-grained analog memory device, according to some embodiments. Positive (i) and negative pulses (ii) are applied to a gate of the CTT to trap and de-trap charges in a high-k gate dielectric layer, therefore changing states of the CTT.

FIG. 1A illustrates how terminals of a CTT 100 can be connected when operated as a fine-grained analog memory device. As illustrated, the CTT 100 is implemented as an n-type transistor, including a source 102 (or a source region of the device), a drain 104 (or a drain region of the device), a channel 106 (or a channel region of the device) between the source 102 and the drain 104, and a gate 108 disposed over the channel 106 and spaced apart by a high-k dielectric layer 110. Referring to FIG. 1A($i$), when a threshold voltage of the CTT 100 is to be increased and a channel conductance of the CTT 100 at substantially fixed gate and drain biases is to be decreased, the source 102 of the CTT 100 is grounded, a positive gate pulse (or a sequence of positive gate pulses) is applied to the gate 108 by a pulse generator 114, and a drain voltage of $V_d$ (nonzero) or 0 is applied by a voltage source 112. As illustrated in FIG. 1A($ii$), when the threshold voltage of the CTT 100 is to be decreased and the channel conductance of the CTT 100 at substantially fixed gate and drain biases is to be increased, both the source 102 and the drain 104 of the CTT 100 are grounded, and a negative gate pulse (or a sequence of negative gate pulses) is applied to the gate 108 by the pulse generator 114.

Figure 1B:
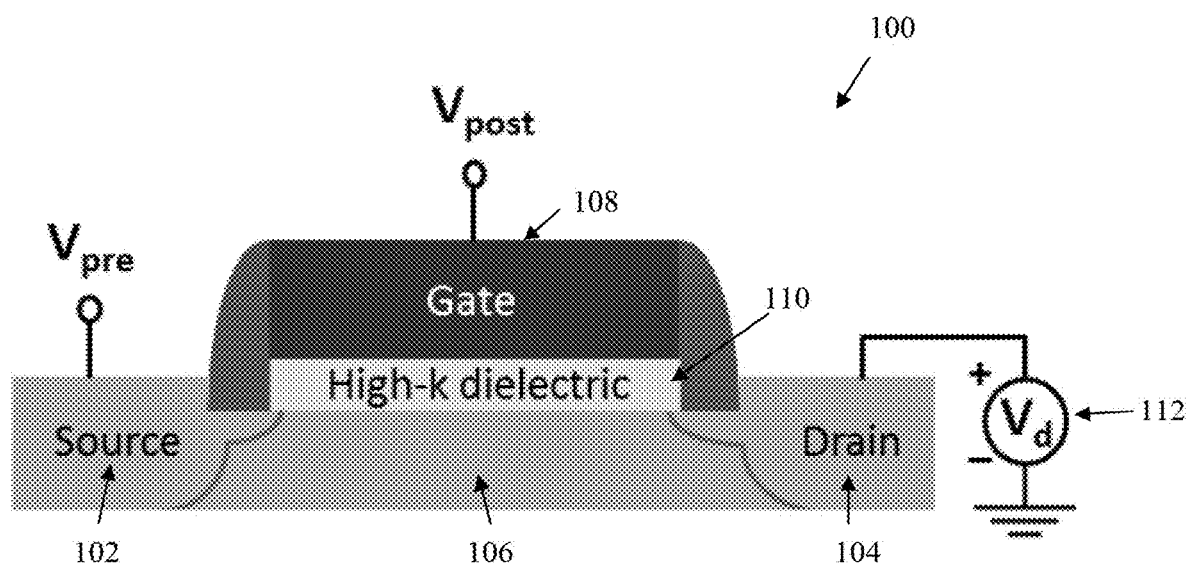
FIG. 1B illustrates the operation of a CTT as a plastic synapse, according to some embodiments. A drain of the CTT is biased at $V_d$, while a source and a gate are supplied with pre- and post-synaptic pulses, respectively.

FIG. 1B illustrates how terminals of the CTT 100 can be connected when operated as a plastic synapse. As illustrated, the CTT 100 is implemented as an n-type transistor, including the source 102, the drain 104, the channel 106 between the source 102 and the drain 104, and the gate 108 disposed over the channel 106 and spaced apart by the high-k dielectric layer 110. For operation as a plastic synapse, the drain 104 of the CTT 100 is biased at a voltage of $V_d$ by the voltage source 112, and pre- and post-synaptic signals are applied to the source 102 and the gate 108 of the CTT 100, respectively. Application of the pre- and post-synaptic signals with respect to the source 102 and the gate 108 can be reversed, namely the pre-synaptic signal can be applied to the gate 108, and the post-synaptic signal can be applied to the source 102. Also, p-type transistors can be configured in a similar manner for operation as plastic synapses.

Figure 2:
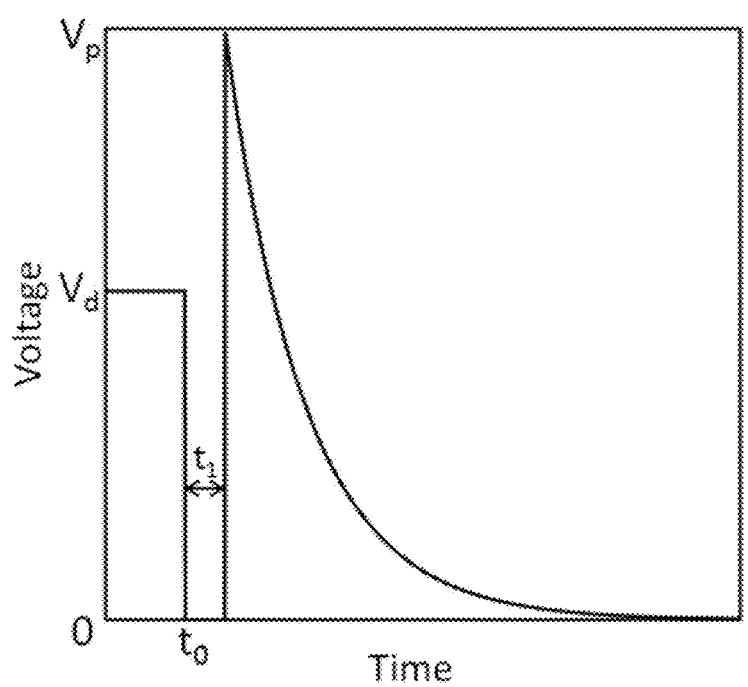
FIG. 2 illustrates an example signaling scheme that is applied as pre- and post-synaptic pulses, according to some embodiments. Before a certain time $t_0$, the voltage is fixed at $V_d$. The voltage then drops to 0 at $t=t_0$ for a period of $t_1$, rises to $V_p$, and gradually decays to 0 thereafter.

FIG. 2 illustrates an example signaling scheme of pre- and post-synaptic pulses: before a certain time $t_0$, the voltage is $V_d$; at $t_0$, the voltage drops to 0 for a period of $t_1$; then the voltage rises to $V_p$ ($>V_d$) and gradually decays to 0. The shape of the decaying voltage can be linear, exponential, or another shape. Varying a particular shape of the decaying voltage can impact programming effects, but the ability to program the CTT to exhibit STDP still holds. Suitable values of $V_d$, $V_p$, and $t_1$ can be selected. With a higher $V_d$, more charge trapping can be induced for a given $V_p$ and therefore a change in threshold voltage ($V_t$) can be greater. The value of $V_p$ can determine the highest gate programming voltage that can be obtained, and the value of $t_1$ can determine the duration of the programming voltage. In a practical implementation, for 22 nm SOI FETs, an example set of values for $V_d$, $V_p$, and $t_1$ are about 0.9 V, about 1.8 V, and about 5 ms, respectively. These values are provided as examples, can vary with materials and fabrication processes, and can be further optimized. Other suitable signaling schemes can be used, such as where a voltage drops below $V_d$ for at least one time period and rises above $V_d$ for at least another time period.

Referring to FIGS. 3A and 3B, when this signaling scheme is applied as pre- and post-synaptic pulses to a CTT, its $V_t$ is changed, and an extent of the change depends on a timing difference (Δt) between the pre- and post-synaptic pulses. As a result, when the gate of the CTT is subsequently biased at a fixed voltage, a channel conductance of the CTT also changes depending on Δt.

Depending on whether the pre-synaptic pulse comes before or after the post-synaptic pulse, the CTT as a synapse transistor can operate in one of two modes: long-term potentiation (LTP) and long-term depression (LTD). In the LTP mode, the pre-synaptic pulse comes before the post-synaptic pulse, resulting in a negative and Δt-dependent gate-to-source voltage for some time duration, which de-traps electrons already trapped in oxygen vacancies in a high-k gate dielectric, and therefore reduces the $V_t$ of the CTT and increases the channel conductance when a gate is biased at a substantially fixed voltage. The increase in channel conductance reproduces the behavior of LTP found in biological synapses. In the LTD mode, the pre-synaptic pulse comes after the post-synaptic pulse, resulting in a positive and Δt-dependent gate-to-source voltage for some time duration, which attracts channel electrons and traps them in the high-k gate dielectric. The trapped electrons increase the $V_t$ of the CTT, and reduce the channel conductance when the gate is biased at a substantially fixed voltage. The reduction of conductance in this case reproduces the behavior of LTD found in biological synapses. Both the extent and the stability of the change in $V_t$ can be enhanced by self-heating generated by a channel current. As a result, a synaptic weight stored in the CTT is nonvolatile.

FIG. 4 illustrates an example crossbar arrangement of CTTs 400 for pattern recognition. The CTTs 400 are situated at intersections between N rows of interconnects 402 (corresponding to and connected to N pre-synaptic neuron devices) and N columns of interconnects 404 (corresponding to and connected to N post-synaptic neuron devices) to recognize a pattern with N pixels. For a CTT 400 situated at the intersection between row A and column B, its drain is biased at $V_d$, its source is connected to the pre-synaptic neuron device A, and its gate is connected to the post-synaptic neuron device B. Because the CTTs 400 can be implemented using transistors used in a SoC, the size of the array (N) can be very large, and the CTTs 400 can exhibit much higher uniformity and reliability than memristors, phase-change materials or other exotic materials.

For the purpose of explanation and by way of example, an N-pixel pattern can be assumed to be black and white. In each training period, the pattern can be presented in such a way to the crossbar array of the CTTs 400: if a pixel numbered P is white, a pulse as shown in FIG. 2 with $t_0$=5 ms is applied by the pre-synaptic neuron device P and a pulse as shown in FIG. 2 with $t_0$=10 ms is applied by the post-synaptic neuron device P; if a pixel numbered P is black, a substantially constant voltage of $V_d$ is applied by the pre-synaptic neuron device P and a substantially constant voltage of 0 is applied by the post-synaptic neuron device P. After each period, $V_t$ of the CTT 400 at row A and column B will be changed in this way: if A is the same as B, $V_t$ increases; otherwise, $V_t$ stays the same. By presenting the pattern to the crossbar array of the CTTs 400 multiple times, the array can learn and recognize the pattern. By measuring the $V_t$ map of the array, the training array can be recovered.

Figure 5:
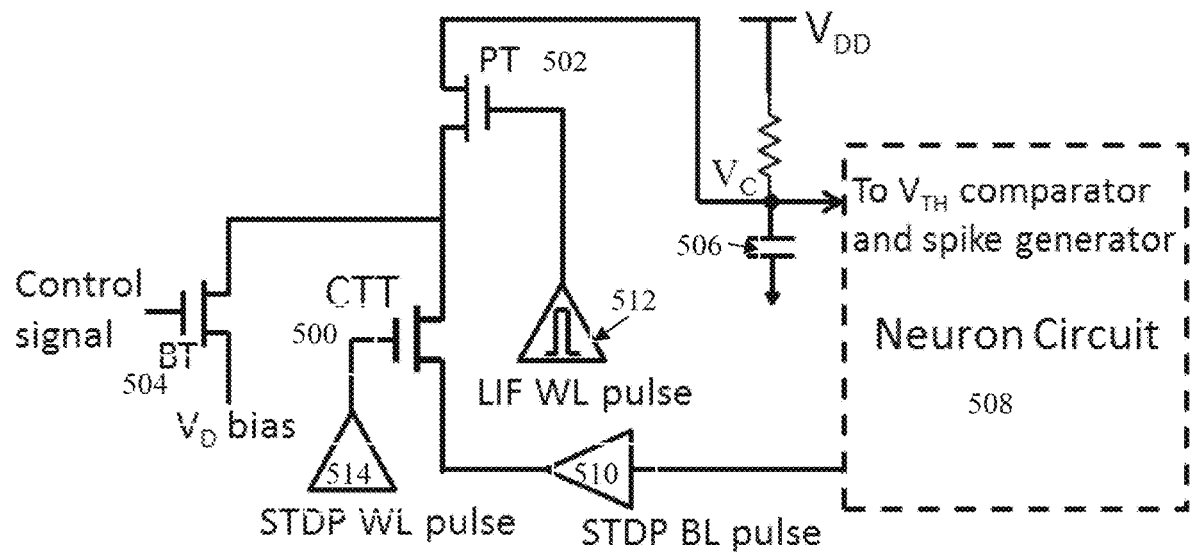
FIG. 5 illustrates a CTT-based synapse device composed of three transistors: a pass transistor (PT), a biasing transistor (BT), and a CTT, according to some embodiments. STDP word-line (WL), leaky-integrate-and-fire (LIF) WL, and control signals are controlled by an axon driver which is activated when a pre-synaptic neuron device fires. STDP bit-line (BL) is an output of a post-synaptic neuron circuit and is fed back to a source of the CTT.

FIG. 5 illustrates a combination of a CTT 500 with CMOS neuron and control circuits to implement a primitive synapse device in a self-adaptive neuromorphic computing system. The synapse device includes three transistors: a pass transistor (PT) 502, a biasing transistor (BT) 504, and the CTT 500, which form a core of the synapse device. A voltage $V_C$ across a capacitor 506 is fed into a comparator of a post-synaptic neuron circuit 508: if $V_C$ is smaller than a threshold voltage of the post-synaptic neuron circuit 508, the post-synaptic neuron circuit 508 stays at its rest state with a STDP bit-line (BL) staying at 0 V; on the contrary, if $V_C$ is larger than the threshold voltage of the post-synaptic neuron circuit 508, the post-synaptic neuron circuit 508 activates and generates a pulse on the STDP BL (through a spike or pulse generator 510). The synapse device operates in two phases when a pre-synaptic neuron device fires: in the first phase, the leaky-integrate-and-fire (LIF) word-line (WL) pulse (through a spike or pulse generator 512) turns on the pass transistor 502, a STDP WL voltage is at a certain value below a threshold voltage $V_t$ of the CTT 500, and the CTT 500 acts as a resistor and discharges the capacitor 506; in the second phase, the pass transistor 502 is turned off, the biasing transistor 504 is turned on and a voltage of $V_d$ is applied (through a voltage source) to a drain of the CTT 500. In the meantime, pulses similar to those shown in FIG. 2 are applied (through spike or pulse generators 510 and 514) to the STDP WL and BL, respectively, programming the device in a similar manner as described above. As a result, the combined application of drain bias $V_d$ and STDP BL and WL pulses changes the $V_t$ of the CTT 500, and the extent of the change in $V_t$ is a function of the timing difference between the STDP BL and WL pulses. This characteristic of the synapse device reproduces the STDP behavior of plastic biological synapses.

Figure 6:
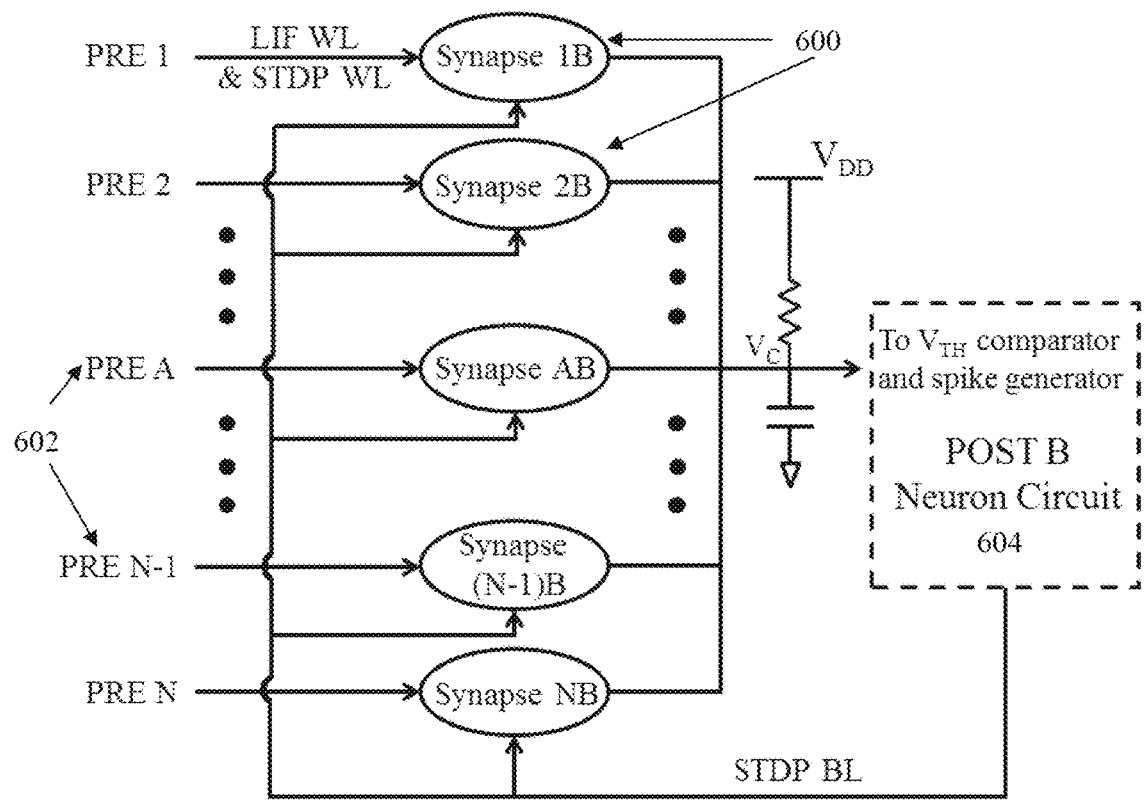
FIG. 6 illustrates an arrangement of CTT-based synapse devices in a neuromorphic system, according to some embodiments.

FIG. 6 illustrates the integration of primitive synapse devices 600, each including three transistors as shown in FIG. 5, in a neuromorphic computing system. Referring to FIG. 6, each pre-synaptic neuron device 602 generates two signals when it fires: STDP WL pulse and LIF WL pulse. These two signals are connected to a respective synapse device 600 in the manner as shown in FIG. 5. All synapse devices 600 connected with a post-synaptic neuron circuit 604 operate together to feed a voltage to the post-synaptic neuron circuit 604 and the circuit 604 determines if or not to fire; when the post-synaptic neuron circuit 604 fires, it generates an STDP BL pulse which is applied to a source of a CTT of each synapse device 600 in the manner as shown in FIG. 5. A large-scale neuromorphic system can be implemented by repeating the sub-system shown in FIG. 6. The system can be used for intelligent tasks or to investigate how the brain works.

FIGS. 7A and 7B illustrate configurations of a CTT in LTD and LTP modes, respectively. In the LTD mode, a source of the CTT is grounded, a drain of the CTT is biased at a voltage $V_d$, and a positive pulse (or a sequence of positive pulses) is applied to a gate of the CTT. A $V_t$ of the CTT is increased, and therefore a channel conductance at a substantially fixed gate bias decreases. In the LTP mode, both the source and the drain of the CTT are grounded, and a negative pulse (or a sequence of negative pulses) is applied to the gate of the CTT. The $V_t$ of the CTT is decreased, and therefore the channel conductance at a substantially fixed gate bias increases. A width of a gate pulse can range from microsecond (μs) scale to millisecond (ms) scale (e.g., about 1 μs to about 1000 ms, about 1 μs to about 100 ms, or about 10 μs to about 100 ms), an amplitude of a positive gate pulse can range from about 1 V to about 3 V in the LTD mode, and an amplitude of a negative gate pulse can range from about −1 V to about −3 V in the LTP mode. FIG. 7C illustrates an example of an evolution of the channel conductance as a synaptic weight as the CTT is cycled between two LTD and two LTP modes. A reversible and reproducible conductance change is achieved.

FIG. 8 illustrates WDP of the CTT derived from FIG. 7C. A change in the conductance, both in the LTP ($f_{LTP}$) and LTD ($f_{LTD}$) modes, is a function of the conductance itself. Using different programming times and voltages can result in different curves reflecting the change in the conductance. These curves can be further incorporated into an unsupervised learning neural network explained in the following.

Figure 9:
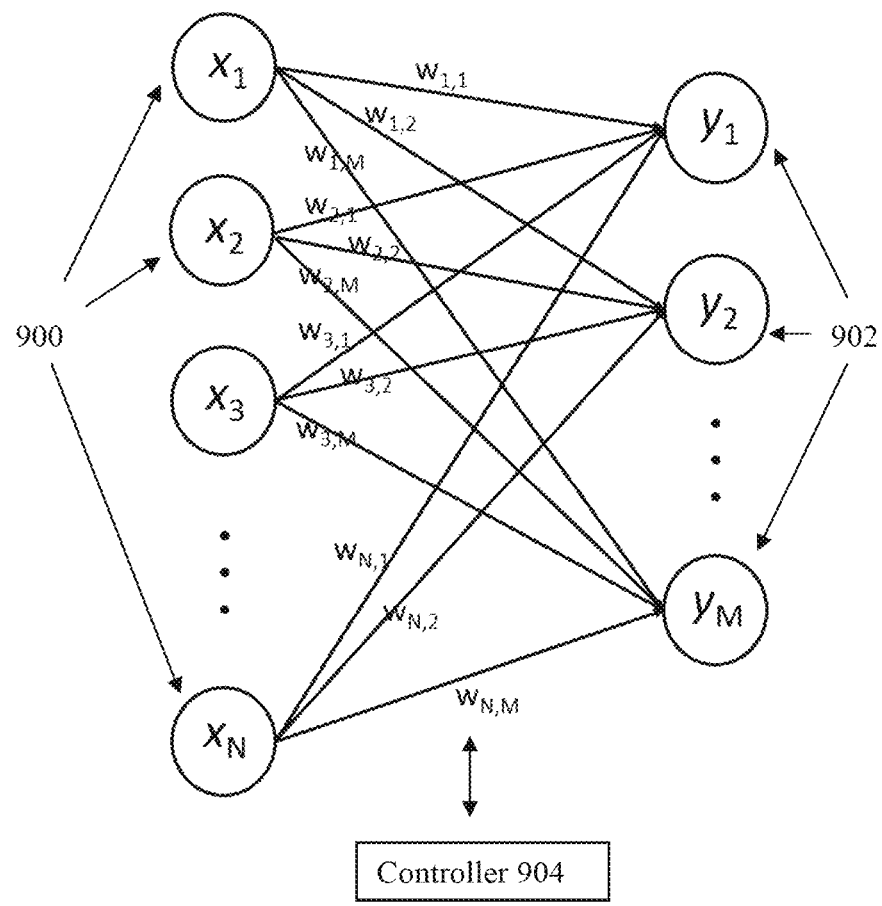
FIG. 9 illustrates an arrangement of CTTs in an unsupervised learning neural network to achieve clustering, according to some embodiments.

FIG. 9 illustrates a single-layer unsupervised learning neural network including CTTs as synapses. The neural network includes N input neuron devices 900 and M output neuron devices 902 connected to the input neuron devices 900 through synapses (as shown as arrows), where N can be the same as or different from M, N≥1, and M≥1. Each time a pattern $(x_1, x_2, \ldots, x_N)$ is presented to the network as an input, an output $y_j$ is calculated to be:

$$y_j = \Sigma_{i=1}^{N} x_i G_{i,j},$$

where $G_{i,j}$ denotes a channel conductance (or weight) of a synapse transistor associated with the ith input neuron device and the jth output neuron device at a substantially fixed gate bias. In a hardware implementation, a source and a gate of all CTTs associated with the jth output neuron device are grounded, and a voltage of $V_d$ (nonzero) or 0 V is applied to a drain: if the ith input neuron device fires, a nonzero $V_d$ is applied; otherwise, 0 V is applied. Total OFF-currents feeding the jth output neuron device are sent to a current comparator. For each presentation of a pattern, the input neuron device with the largest output fires, and synaptic weights associated with this neuron are updated with a set rule. In this example, a winner-takes-all (WTA) rule is applied:

$$\Delta G_{OFF} = POST \cdot (PRE \cdot (f_{LTD} + f_{LTD}) - f_{LTD}),$$

where PRE and POST are binary values which assume the value of 1 when the corresponding neuron device fires and 0 otherwise, and $f_{LTP}$ and $f_{LTD}$ are WDP curves as shown in FIG. 8. In the training of the network, patterns $(x_1, x_2, \ldots, x_N)$ are presented to the input neuron devices and the conductance (or weights) of CTTs are updated per this rule. Updating of the conductance is directed by a controller 904, which is connected to the input neuron devices 900, output neuron devices 902, and the synapses, and which can be implemented in hardware using appropriate electronic circuitry. After a number of presentations of patterns, substantially perfect clustering can be achieved. It is to be understood that more than one layer of neuron devices can be included, and a learning rule different from the WTA rule can be used.

Figure 10:
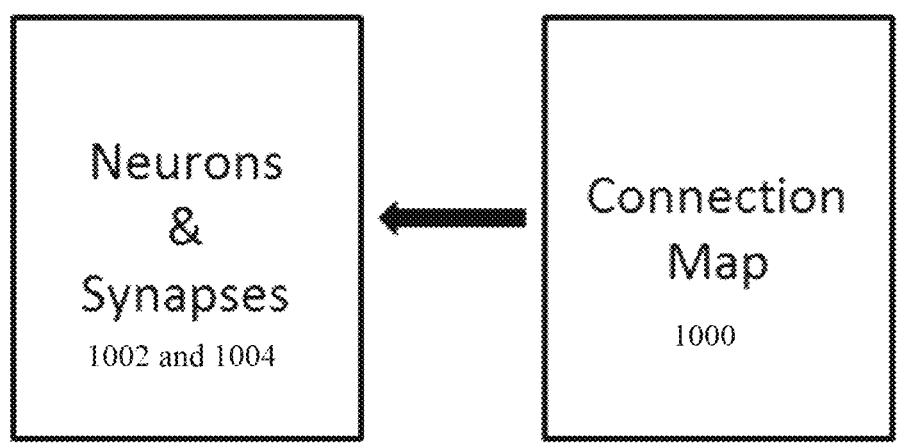
FIG. 10 illustrates a schematic of CTT-based synapse devices in a reconfigurable neuromorphic system. The reconfigurable neuromorphic system is implemented by following a connection map and programming corresponding transistors in the system.

FIG. 10 illustrates a schematic of CTT-based synapse devices in a reconfigurable neuromorphic system. A connection map 1000 is a memory array which stores information on connections between all neuron devices 1002 and synapse devices 1004. The reconfigurable neuromorphic system is implemented by following the connection map 1000 and programming appropriate transistors in the system. The system can be configured in various ways and can be used for various applications. For example, the system can be configured to investigate how the brain works, or the system can be configured for a particular neuromorphic application.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects.

As used herein, the terms "connect," "connected," and "connection" refer to an operational coupling or linking.

Connected objects can be directly coupled to one another or can be indirectly coupled to one another, such as through another set of objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, concentrations, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A neuromorphic computing system comprising:
    a synapse device including a charge-trapping transistor including a source, a gate, and a drain;
    a first neuron device connected to the source and configured to apply a first time-varying signal to the source;
    a second neuron device connected to the gate and configured to apply a second time-varying signal to the gate; and
    a voltage source connected to the drain and configured to apply a voltage $V_d$ to the drain,
    wherein each of the first time-varying signal and the second time-varying signal includes a voltage value greater than $V_d$, and each of the first time-varying signal and the second time-varying signal includes a voltage value less than $V_d$.

2. The neuromorphic computing system of claim 1, wherein the first time-varying signal and the second time-varying signal are shifted in time.

3. The neuromorphic computing system of claim 1, further comprising:
    a plurality of synapse devices including the synapse device;
    a plurality of first neuron devices including the first neuron device, the plurality of first neuron devices connected to sources of respective ones of the plurality of synapse devices; and
    a plurality of second neuron devices including the second neuron device, the plurality of second neuron devices connected to gates of respective ones of the plurality of synapse devices.

4. The neuromorphic computing system of claim 1, further comprising:
    a plurality of synapse devices including the synapse device; and
    a plurality of second neuron devices including the second neuron device, the plurality of second neuron devices connected to gates of respective ones of the plurality of synapse devices,
    wherein drains of multiple ones of the plurality of synapse devices are connected to the same voltage source, and sources of multiple ones of the plurality of synapse devices are connected to the same first neuron device.

5. A method of operating a neuromorphic computing system, comprising:
    providing a synapse device including a charge-trapping transistor including a source, a gate, and a drain;
    operating the synapse device in a first mode by applying a positive voltage to the gate with respect to the source of the charge-trapping transistor for a first time duration, while maintaining the drain at a drain voltage different from the positive voltage; and
    operating the synapse device in a second mode by applying a negative voltage to the gate with respect to the source of the charge-trapping transistor for a second time duration,
    wherein operating the synapse device in the second mode further includes grounding the drain of the charge-trapping transistor.

6. The method of claim 5, wherein operating the synapse device in the first mode further includes applying a nonzero voltage to the drain of the charge-trapping transistor.

* * * * *